(12) United States Patent
Compen et al.

(10) Patent No.: US 7,385,670 B2
(45) Date of Patent: Jun. 10, 2008

(54) LITHOGRAPHIC APPARATUS, CLEANING SYSTEM AND CLEANING METHOD FOR IN SITU REMOVING CONTAMINATION FROM A COMPONENT IN A LITHOGRAPHIC APPARATUS

(75) Inventors: Rene Theodorus Petrus Compen, Valkenswaard (NL); Joost Jeroen Ottens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/957,754

(22) Filed: Oct. 5, 2004

(65) Prior Publication Data

US 2006/0072085 A1 Apr. 6, 2006

(51) Int. Cl.
*G03B 27/52* (2006.01)
*G03B 27/32* (2006.01)

(52) U.S. Cl. .......................................... 355/30; 355/77
(58) Field of Classification Search .................. 355/30, 355/53, 77
See application file for complete search history.

(56) References Cited

U.S. PATENT DOCUMENTS

| | | | |
|---|---|---|---|
| 5,023,424 A * | 6/1991 | Vaught | 219/121.6 |
| 5,853,962 A | 12/1998 | Bowers | 430/331 |
| 6,392,738 B1 * | 5/2002 | van de Pasch et al. | 355/30 |
| 6,627,846 B1 * | 9/2003 | Yogev et al. | 219/121.85 |
| 6,635,845 B2 * | 10/2003 | Lee et al. | 219/121.68 |
| 6,724,460 B2 * | 4/2004 | Van Schaik et al. | 355/30 |
| 6,829,035 B2 * | 12/2004 | Yogev | 355/30 |
| 6,908,567 B2 * | 6/2005 | Uziel | 216/66 |
| 2005/0058836 A1 | 3/2005 | Goldstein | 428/411.1 |

FOREIGN PATENT DOCUMENTS

| | | |
|---|---|---|
| JP | 2000-58494 | 2/2000 |
| JP | 2003-022993 | 1/2003 |
| JP | 2004-141704 | 5/2004 |
| KR | 2001-0066292 A | 7/2001 |
| KR | 2001-0083591 | 9/2001 |

\* cited by examiner

*Primary Examiner*—Rodney E Fuller
(74) *Attorney, Agent, or Firm*—Pillsbury Winthrop Shaw Pittman, LLP

(57) ABSTRACT

A lithographic apparatus is disclosed. The apparatus includes a cleaning system for cleaning a component in the lithographic apparatus in situ. The cleaning system is arranged to provide a cleaning environment in proximity of a predetermined position on a component to be cleaned. The system is also arranged to provide the cleaning environment substantially independent of a type of contamination present at the predetermined position.

33 Claims, 6 Drawing Sheets

LITHOGRAPHIC APPARATUS, CLEANING SYSTEM AND CLEANING METHOD FOR IN SITU REMOVING CONTAMINATION FROM A COMPONENT IN A LITHOGRAPHIC APPARATUS

FIELD

The present invention relates to a lithographic apparatus, a cleaning system, and a cleaning method for in situ removal of contamination from a component in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Although lithographic apparatus are operated in clean rooms and flushed with clean air, contamination of the apparatus does occur and, depending on the location and type of contaminant, causes various problems. For example, inorganic contaminants on the mask deriving from the air in the clean room or from manufacture, transportation and storage of the mask can cause localized absorption of the projection beam leading to dose errors and improper imaging of mask features or even printing of marks in what should be blank areas. Particulates on the substrate table can distort the substrate leading to localized focus errors (known as hot spots). When due to contamination on a substrate table, the substrate adopts a bended position, and the pattern on the surface of the bended substrate does not correspond to the pattern intended to be transferred to the substrate, thereby contributing to bad overlay.

In addition to the ambient air and the manufacture, etc., of masks and substrates, sources of contamination include resist debris sputtered from the substrate by the projection beam during exposures, and mechanical contact between moving parts of the apparatus, which may cause particulates to be dislodged from the contacting surfaces. Contamination may also include metal and/or oxide particles.

Most of the contamination is presumably entering the lithographic apparatus via the substrates which have been treated in processes prior to entering the apparatus. In particular, resist contamination is thought to enter the apparatus via the wafers.

To minimize errors caused by contamination, susceptible parts of the apparatus, such as masks, mask tables, and substrate tables, are cleaned frequently. This generally is a time-consuming manual task, taking two hours or more to clean a substrate table, for example, which causes undesirable downtime of the apparatus and must be carried out by skilled engineers. On occasion, manual cleaning fails to remove the contaminants and must be repeated. Selective cleaning of a burl table is disclosed in EP-1 093 022-A in which an abrasive tool or electromagnetic radiation of unspecified form is used. U.S. Pat. No. 6,249,932 discloses a manual cleaning head that uses blown air and vacuum for cleaning a table in a lithographic projection apparatus. Various methods of cleaning substrates are known—see e.g. WO 02/053300 and WO 02/42013—but these require the substrates to be placed in special machines.

To overcome the problems of downtime, the lithographic apparatus may be provided with a cleaning device for cleaning in situ a component in the lithographic apparatus, as disclosed in EP 1329773 A2. The cleaning device may provide a laser to ablade and/or thermally dislodge contaminants. The wavelength of the laser beam is chosen such that absorption by the contaminants that are expected to be present on the component be cleaned, is maximal. When a short pulse length is used, in the order of less than 100 nanoseconds, the sudden thermal expansion difference between the heated contamination and the component may cause a shockwave, resulting in G-forces high enough to loosen the contamination from the component. A clean device may additionally, or alternatively, provide in a non-ionizing, low pressure environment around the component to be cleaned, so that electrostatic forces due to a potential difference between a cleaning tool and the component to be cleaned are created. The potential difference and separation between the tool and the component to be cleaned that are needed to remove contaminants depends on the contaminants to be removed and the properties of the surface to which they are adhered. In other words, in either way, successfully operating the cleaning device depends on prior knowledge about the type of contamination to be removed.

SUMMARY

It is an aspect of the present invention to provide a lithographic apparatus with a more versatile cleaning facility.

It is an aspect of the present invention to provide a versatile cleaning system for in situ cleaning of a component in a lithographic apparatus.

It is an aspect of the present invention to provide a versatile cleaning method for in situ removal of contamination from a component in a lithographic apparatus.

According to an aspect of the invention, there is provided a lithographic apparatus that is arranged to transfer a pattern from a patterning device onto a substrate. The apparatus includes a cleaning system for cleaning a component in the lithographic apparatus in situ. The cleaning system is arranged to provide a cleaning environment in proximity of a predetermined position on a component to be cleaned. The system is further arranged to provide this cleaning environment substantially independent of a type of contamination present at the predetermined position.

According to an aspect of the invention, there is provided a lithographic apparatus. The apparatus includes an illumination system for conditioning a beam of radiation, and a support structure for supporting a patterning device. The patterning device is configured to impart the beam of radiation with a pattern in its cross-section. The apparatus also includes a substrate table for supporting a substrate, a projection system for projecting the patterned beam of radiation onto a target portion of the substrate, and a cleaning system for cleaning a component in the lithographic apparatus in situ. The cleaning system is arranged to provide a cleaning environment in proximity of a predetermined position on the component to be cleaned. The system is further arranged to provide the cleaning environment substantially independent of a type of contamination present at the predetermined position.

According to an aspect of the invention, there is provided a cleaning system for in situ cleaning a component in a lithographic apparatus. The cleaning system is arranged to provide a cleaning environment proximity of a predetermined position on a component to be cleaned. The system is further arranged to provide this cleaning environment substantially independent of a type of contamination.

According to an aspect of the invention, there is provided a cleaning method for in situ removal of contamination from a component in a lithographic apparatus. The method includes providing, at least in the proximity of a predetermined position on a component to be cleaned, a cleaning environment that is independent of a type of contamination to be removed.

According to an aspect of the invention, there is provided a cleaning method for removing contamination from a component in a lithographic apparatus in situ. The method includes detecting the contamination on the component, identifying a predetermined position to be cleaned on the component, and cleaning the predetermined position with a cleaning system in situ. The cleaning system is arranged to provide a cleaning environment in proximity of the predetermined position. The system is further arranged to provide the cleaning environment substantially independent of a type of contamination.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
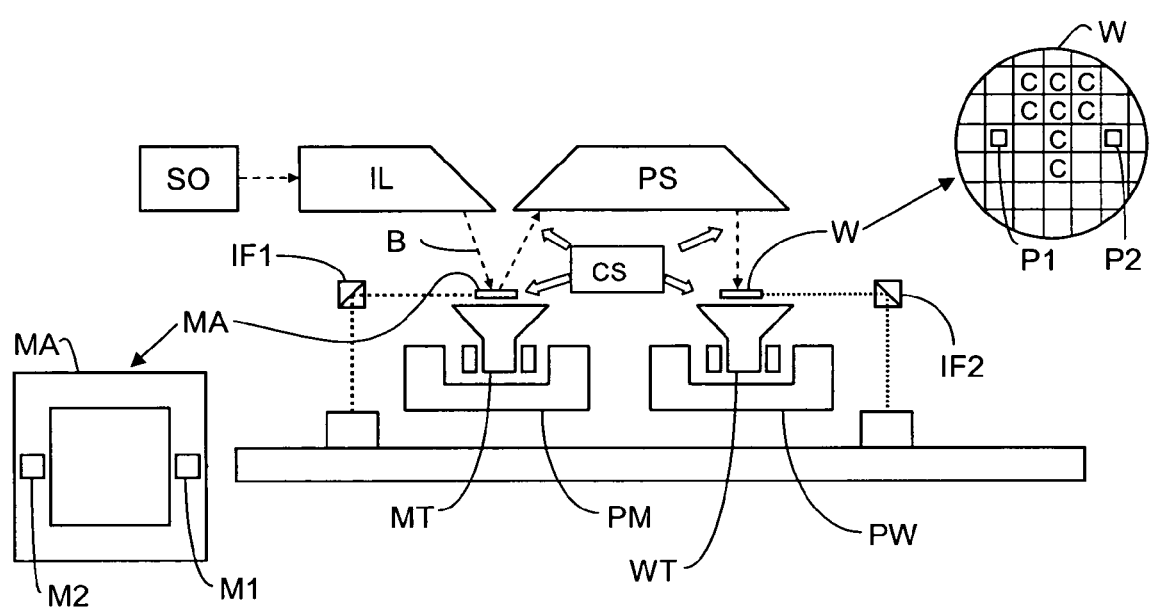
FIG. 1 depicts a lithographic apparatus according to an embodiment of the invention.

FIG. 1 schematically depicts a lithographic apparatus according to one embodiment of the invention. The apparatus may include, as shown, an illumination system (illuminator) IL configured to condition a radiation beam B (e.g. UV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The apparatus includes a cleaning system CS for cleaning a component in the lithographic apparatus in situ, thereby avoiding the need to open up and dismantle the apparatus to remove the component to be cleaned. The cleaning system CS is arranged to provide a cleaning environment in at least the proximity of a predetermined position on the component to be cleaned. The cleaning system CS is further arranged to provide this cleaning environment substantially independent of a type of contamination present at the predetermined position. The open arrows shown in FIG. 1 indicate possible predetermined positions and their proximities.

The illumination system may include various types of optical components, such as refractive, reflective, magnetic, electromagnetic, electrostatic, or other types of optical components, or any combination thereof, for directing, shaping, and/or controlling radiation.

The support structure MT supports, i.e. bears the weight of, the patterning device MA. It holds the patterning device MA in a manner that depends on the orientation of the patterning device MA, the design of the lithographic apparatus, and other conditions, such as whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example, with respect to the projection system PS. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate, for the exposure radiation being used, or for other factors, such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example, when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
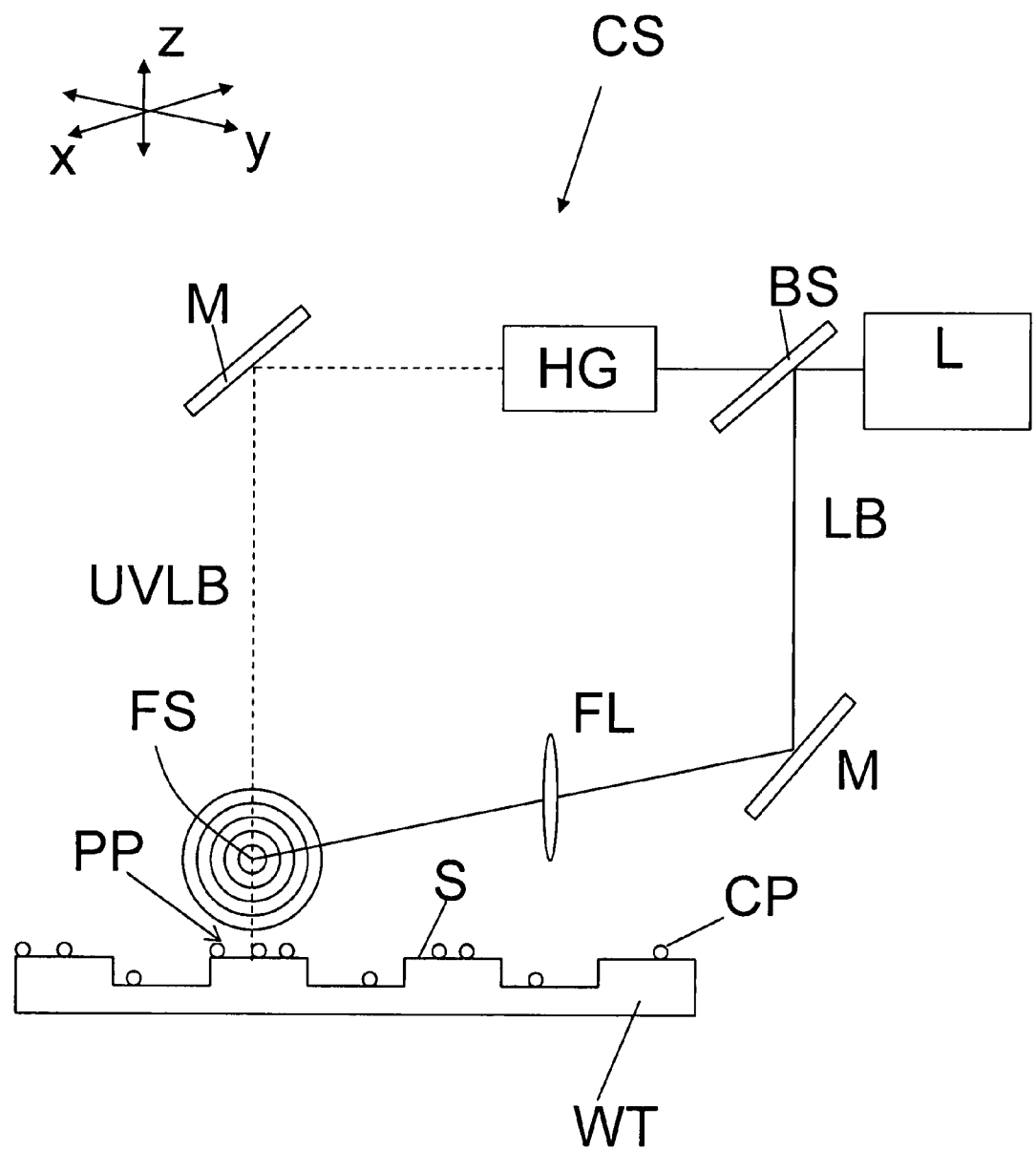
FIG. 2 depicts schematically a part of an embodiment of the invention.
Figure 3:
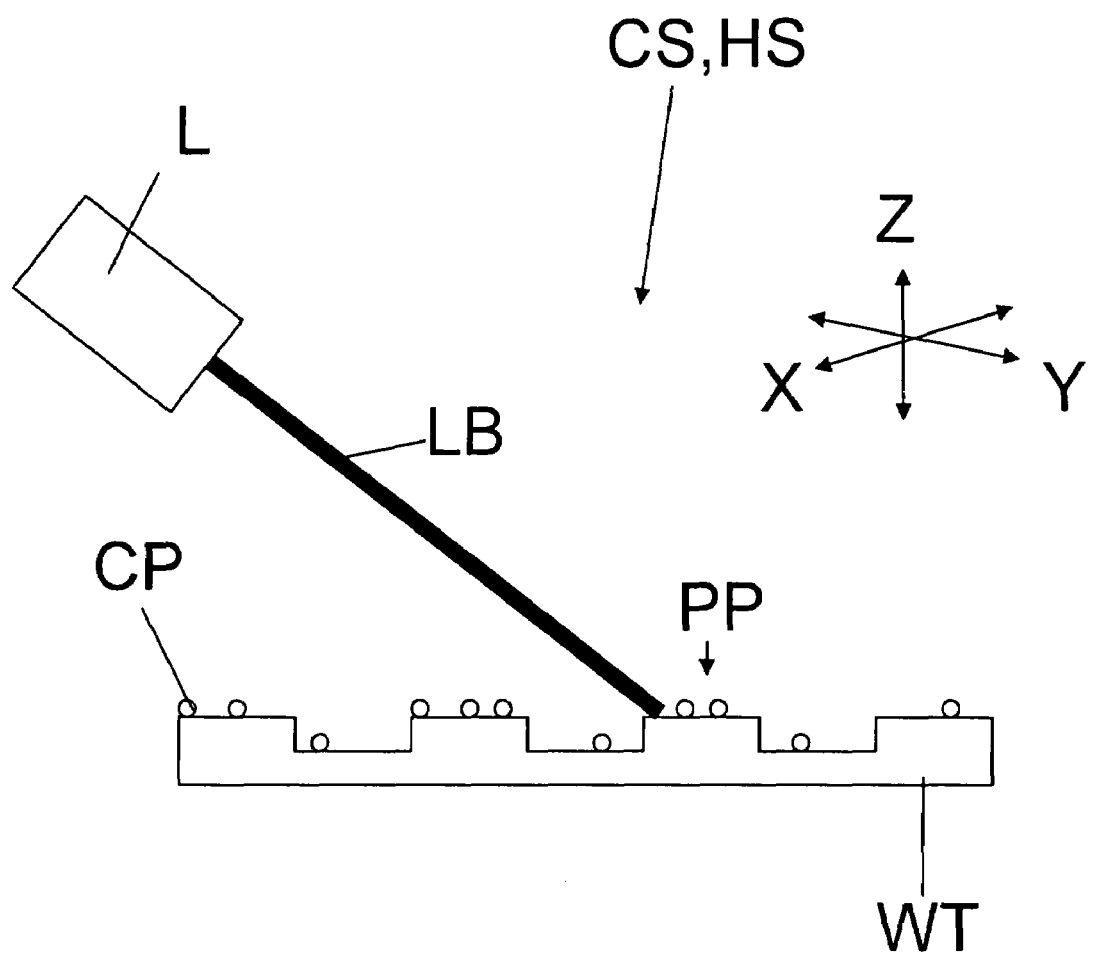
FIG. 3 depicts schematically a part of an embodiment of the invention.
Figure 4:
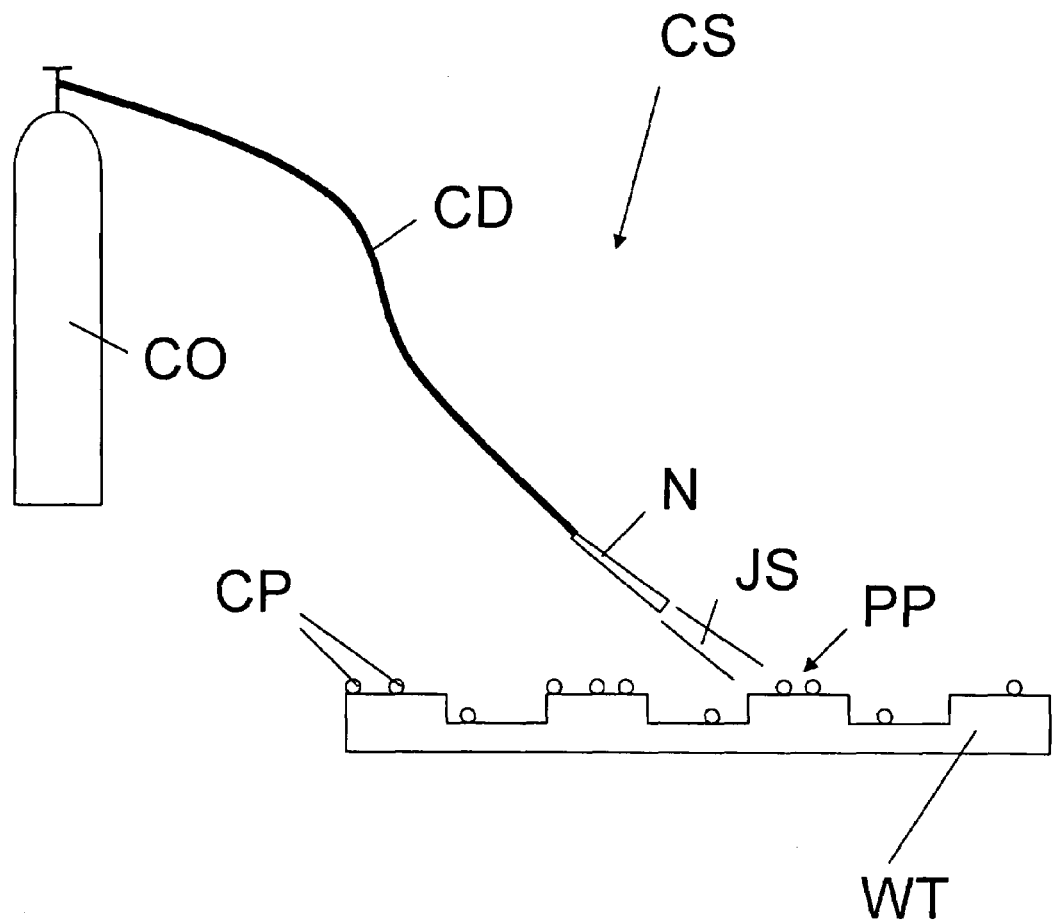
FIG. 4 depicts schematically a part of an embodiment of the invention.

FIGS. 2-6 each schematically show a part of an embodiment of the invention. FIG. 2-4 show schematically a cleaning system for in situ cleaning a component in a lithographic apparatus. By way of example, the component to be cleaned is the substrate table WT. It should, however, be clear that the invention may be applied with the aim to clean other components. The cleaning system CS is arranged to provide a cleaning environment in at least a proximity of a predetermined position PP on the component to be cleaned. The cleaning environment is an environment that is effective in removing contamination from the component to be cleaned.

The system is further arranged to provide this cleaning environment substantially independent of a type of contamination present at a predetermined position. An advantage is that no specific knowledge is needed with respect to the size and or composition of the contamination, i.e. the type of contamination, present at the predetermined position. Only positions of contamination are relevant. A device capable of detecting the presence of contamination, i.e. a device capable of determining contaminated positions on the component to be cleaned, is described in EP 1 093 022 A2, which is incorporated herein by reference in its entirety.

FIG. 2 shows a cleaning system CS in more detail. The cleaning system CS includes a plasma system for locally providing a plasma. The plasma system shown is arranged to provide a shockwave. In use, contamination originating from the resist will be etched away by the plasma. Metal or oxide particles will be blown away by the shockwave. In the drawing, no difference is made between contaminating resist particles and metal and/or oxide particles. Both types, i.e. contamination in general is referred to with CP. The plasma system is further arranged to focus a laser beam in the proximity of the predetermined position on a component to be cleaned. Hence, it is possible to clean very selectively and very accurately, enhancing efficiency and reducing cleaning time. In more detail, the plasma system may include a laser L for providing a laser beam LB. By use of optical components such as, for example, a mirror M and a focusing lens FL, the laser beam may be focused in the proximity of the predetermined position PP on the component to be cleaned. The predetermined position PP may, for example, be a surface S of a so-called "burl" which is a protrusion of the wafer table WT for supporting, in use, the wafer. The plasma system may include a beam splitter BS and a harmonic generator HG, for, respectively, directing a laser beam to the harmonic generator and producing, for example, a UV laser beam UVLB. It has turned out that with this additional UV laser beam arriving at the spot FS onto which the laser is focused, advantageous cleaning of the proximity of the predetermined position, and the predetermined position PP itself, may occur in an efficient manner. The laser may heat the surface to be cleaned, including G-forces due to a rapid difference in expansion between the contaminating particles and the surface to be cleaned. To further enhance efficiency, it may be necessary to optimize the distance D between the predetermining position PP and the spot onto which the laser beam LB is focused. This optimization may be carried out by routine experiments by a skilled person. The distance D may also be pre-set on the basis of for example required accuracies and a predetermined relation between the accuracies produced and the distance D. Also an automated optimization procedure may be employed for finding a suitable distance D.

The plasma system may be arranged such that the focused laser beam may selectively scan the surface of the wafer fable WT on the basis of the predetermined positions. With a cleaning system of an apparatus according to the invention, cleaning occurs in at least the proximity of the predetermined positions, and, thus, in the predetermined positions itself. For this purpose, optical components may be rotatable and/or transferable. It is, however, also possible that the whole cleaning system is capable of moving along the surface.

FIG. 3 shows an alternative embodiment of a cleaning system as part of an embodiment of the invention. In this case, a cleaning system includes a heating system for heating the components be cleaned in the proximity of the predetermined position. In particular, the heating system may include a laser that is arranged to provide a beam with a wavelength that is absorbable by the component to be cleaned. The laser may provide a beam that is directed perpendicular to the surface of the component to be cleaned, or as shown a beam that approaches the surface under an angle. No specific knowledge is required of the type of contamination present at the predetermined position. The laser may further be arranged to provide a beam with a pulse longer than 0.1 milliseconds, or more in particular with a pulse longer than 0.5 milliseconds. This embodiment may include a laser that is arranged to provide a beam with a pulse shorter than 0.15 microseconds or more in particular a pulse shorter than 0.10 microseconds. This may be the same laser as the laser that provides the pulses longer than 0.1 milliseconds or longer than 0.5 milliseconds. Two lasers may be employed to meet these requirements. In use, the component to be cleaned is heated locally; i.e. in at least the proximity of the predetermined positions. Any wavelength may be chosen as this type of laser beam is simply absorbed by the component to be cleaned. There is no need to fine-tune the wavelength such that the contamination absorbs the laser light. In order to keep costs low, a laser arranged to provide a beam with an infrared wavelength may be used. In particular, when a wavelength of about 1064 nm is used, contamination including both oxide particles and resist particles may be removed from the component to be cleaned by using this cleaning system. Without intending to be bound by any theory, it is believed that the resist will be heated by conduction and evaporate away from the component to be cleaned, whereas the metal and oxide particles are loosened from the component to be cleaned by high G-forces that result from thermal expansion differences between the wafer table WT and these particles. Other advantages of this embodiment are not only related to a low cost laser that may be used for this system, but also to convenient delivery of the laser light to the required position by means of fiber delivery.

FIG. 4 shows another cleaning system as part of an embodiment of the invention. This cleaning system includes a snow system for locally providing snow particles JS. In particular, the cleaning system is arranged to provide a jet of snow particles. The snow particles may be formed from $CO_2$ and/or Ar. Apparatus and methods for providing snow particles are known from, for example, U.S. Pat. No. 6,099,396 and U.S. Pat. No. 6,066,032, both of which are incorporated herein by reference. For example, liquid $CO_2$ that is stored under pressure in a container CO and expands after being transported through a conduit CD in a nozzle N cools down and forms soft snow particles, mostly micron-sized. The removal of contaminants from the components to be cleaned may occur via dissolving, in the case of organic contaminants (resist), by impulse to remove particles such as metal and/or oxide particles, and by lowering the adhesive force between the contamination and the components to be cleaned, due to rapid cooling of the component to be cleaned and a large thermal "shrinkage" difference between the contaminants and components to be cleaned. The snow particles may also clean the resist particles away, as a result of an abrasive action. It is possible that this cleaning system may be combined with, or includes, a heating device for reducing temperature recovery time after cleaning. This embodiment has, in use, shown to be a very efficient cleaning device, low in cost, and does not causes damage to the component to be cleaned. The cleaning system may operate substantially independent of contaminants and the type of components to be cleaned.

Although the jet of snow particles should be aligned such that the snow particles arrive at least in the proximity of the predetermined position, very little accuracy is needed. In general, if the spot to be cleaned is relatively large, the alignment may be relatively inaccurate. Also, another nozzle may be used for cleaning a relatively large spot. The nozzle may be designed to improve the cleaning efficiency. It is, for example, conceivable that a venturi is employed, as described in "Carbon dioxide snow cleaning—The next generation of cleaning", R. Sherman, Paul Adams, Precision Cleaning '95 Proceedings, p. 271-300. Also, the shape and size of the actual outlet of the nozzle may be optimized. It is further possible to apply a single or a double expansion for production of the snow particles. Methods known to adjust the snow size and velocity during cleaning may also be employed, such as those described in U.S. Pat. No. 4,806,171, incorporated herein by reference. A position orientation of the nozzle may be optimized to minimize waste of the snow particles. The skilled person may, using routine experiments, find an optimal angle at which the nozzle will enclose with the surface of the component to be cleaned, when cleaning is efficient.

It is possible that the snow system may be arranged to apply the snow-jet in a direction opposite a direction into which the surface to be cleaned moves due to, for example, a predetermined scanning. The impact of the snow particles would then be due to the relative speed increased, resulting in a higher impulsive force and an improved cleaning efficiency.

The system may be arranged to automatically adjust the direction and/or angle of a jet of the snow flakes as described in U.S. Pat. No. 5,725,154, incorporated herein by reference. Cleaning using the snow system may further occur in a stepping mode or a scanning mode.

It is possible that the snow system may be arranged to provide a pulsed jet of snow particles as, for example, described in U.S. Pat. No. 5,725,154 incorporated herein by reference. This may be done by switching a valve, or by, for example, driving the nozzle in an oscillatory manner, leading to a kind of "snow plough" effect as described in U.S. Pat. No. 6,530,823, incorporated herein by reference. A valve may be close to an outlet of the nozzle to minimize start and stop time, and to provide a step response. The valve may be incorporated in the outlet and as such control a flow of the snow particles. The snow system may be arranged such that high velocity gas is injected in the nozzle to accelerate the snow particles leaving the nozzle. This may be warm gas and/or an ionized gas to respectively reduce the cooling of the component to be cleaned and to reduce static charging of the component to be cleaned, as described in U.S. Pat. No. 5,725,154. It is also possible that the snow system may be arranged to inject low temperature nitrogen gas on the snow particles as produced during the adiabatic expansion. The hardness of the snow particles may increase and that consequently the abrasive manner of cleaning the component to be cleaned may be more thorough. It is further possible that the snow system may be arranged to include a control system for measuring and/or controlling the pressure of gas, for example, $CO_2$ gas, available to be used for providing snow particles. The control system may include a pressure gauge and/or, for example, an instrument to establish the mass of a container in which the gas is contained. It is possible that the pressure of the gas flowing to the nozzle may be increased. This may be carried out using a compression device or, for example, a device arranged to heat the container in which the gas is maintained.

A lithographic apparatus that includes a snow system as the cleaning system may include a recovery system for reducing down time of the component to be cleaned. The recovery system may be arranged to provide heat to the components which have just been cleaned or are being cleaned. This may be carried out by providing a heating jet, a heating light source, or integration of a heating device in the component to be cleaned. It is, for example, conceivable that a heating device is integrated in the wafer table. It is also possible to reduce the recovery time by minimizing the spot diameter of the jet of the snow particles and/or to improve the alignment. It is also possible that the snow system is arranged to intermittently provide a jet of snow particles as described in U.S. Pat. No. 5,725,154, incorporated herein by reference. The snow system may be arranged such that when the nozzle is directed from a first position to be cleaned towards a second position to be cleaned, no snow particles are provided. When the whole wafer table is regarded as a predetermined position to be cleaned, a dedicated nozzle, a ray of nozzles, or a flat wide nozzle may be employed as, for example, described in U.S. Pat. No. 6,099,396, incorporated herein by reference.

The lithographic apparatus that includes a snow system as the cleaning system may be arranged to maintain a relatively low humidity in the surroundings of a component to be cleaned. It is, however, also possible to add solvents to the predetermined positions on the components to be cleaned as this, in general, improves cleaning efficiency, as described in U.S. Pat. No. 5,725,154.

To further avoid static charging of the component to be cleaned, the component may be grounded, or, for example, surrounded by ionized air, which can reach the component to be cleaned. It is also possible that the tube and/or of the snow system may be grounded, as described in U.S. Pat. No. 6,530,823, incorporated herein by reference. It is possible that a lithographic apparatus that includes a snow system as the cleaning system may further include a gas flow control system for providing a gas flow that aims to remove contaminant particles that have been released from the component that has been cleaned.

If the snow particles include carbon dioxide, the snow system may include a carbon dioxide purifier, such as a filter. Such a purifier may also be used in snow systems that are arranged to provide snow particles form a gas different form $CO_2$.

Figure 5:
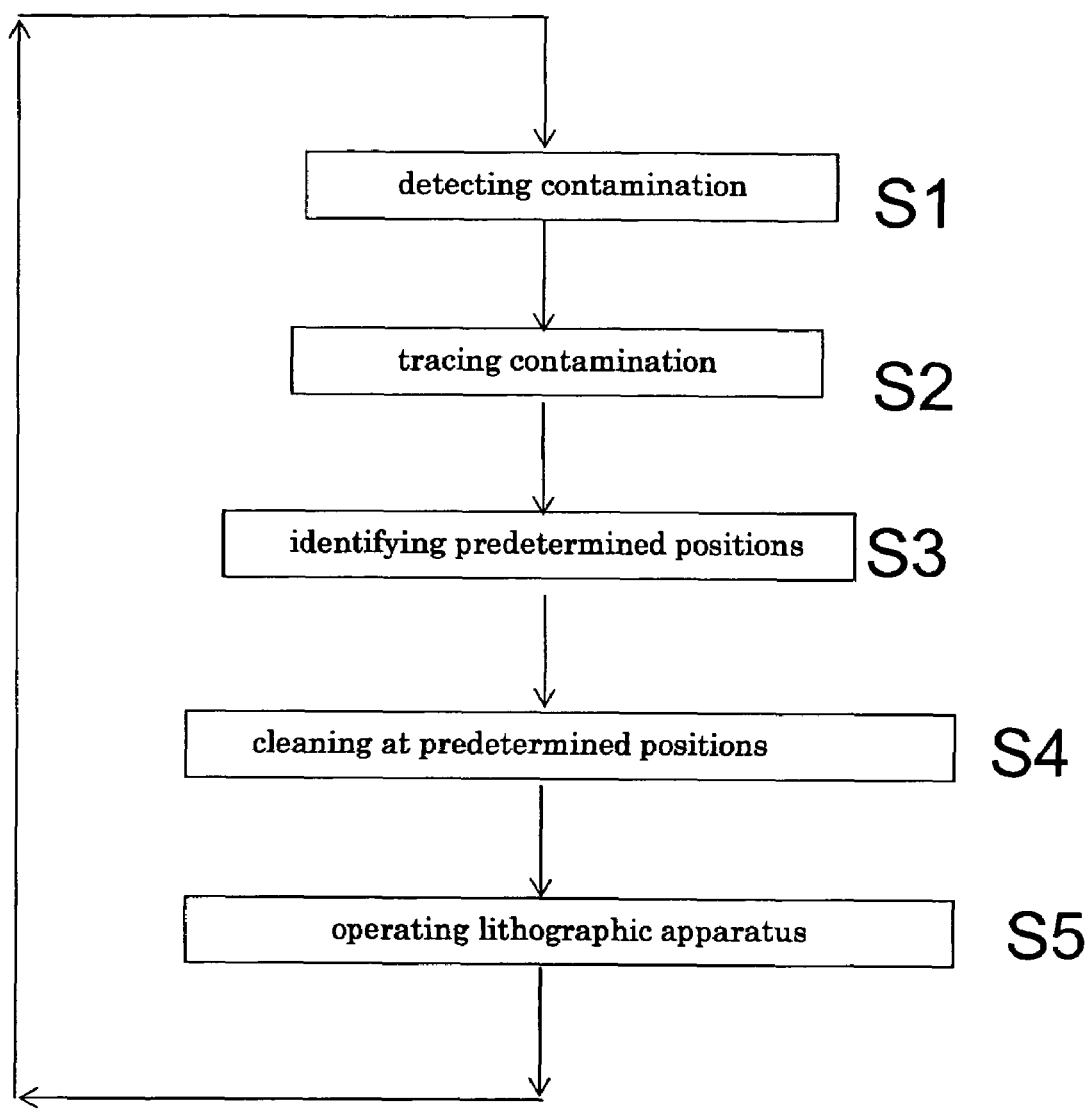
FIG. 5 depicts schematically a part of an embodiment of the invention.

FIG. 5 shows schematically a cleaning method for in situ removing contamination from a component in a lithographic apparatus. In a first step S1, contamination may be detected directly or indirectly. Directly detecting contamination may occur when dedicated apparatuses may detect contamination. In that case, immediate tracing of the contamination may occur, thereby leading to identifying a number of predetermined positions on components to be cleaned. (Step S1, S2 and S3 in FIG. 5.) Such a dedicated apparatus is described in EP 1 093 022, which is incorporated herein by reference. Indirectly detecting contamination may occur when required specifications with respect to a device produced by the lithographic apparatus are not met, or, for example, a bad overlay is observed (bad overlay refers to irreproducibility when a similar pattern is transferred onto a plurality of substrates). In that case, an apparatus as described in EP 1 093 022 A2 may be employed to trace contamination (S2), which leads to identifying predetermined positions that need to be cleaned (S3). Once the positions on which contamination is present have been determined, i.e. the predetermined positions are known, cleaning may occur at the predetermined positions (S4), using a cleaning system as described above. After cleaning the predetermined positions, the lithographic apparatus may be in normal operation. This will eventually lead again to contamination which will be detected and step S1 may again trigger the occurrence of the cleaning method as outlined above.

Figure 6:
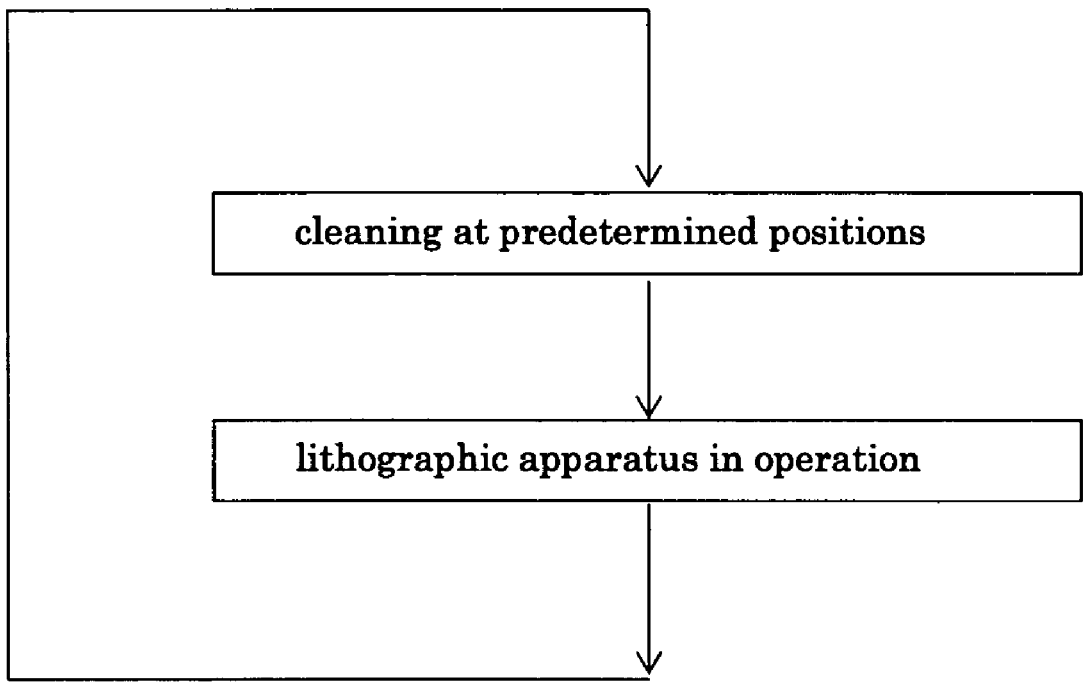
FIG. 6 depicts schematically a part of an embodiment of the invention.

FIG. 6 shows schematically a cleaning method according to an embodiment of the invention. In this case, cleaning a predetermined position is followed by normal operation of the lithographic apparatus, which is again followed by cleaning the predetermined positions. In this embodiment, the predetermined positions have been predetermined without detecting the presence of contamination on positions. It may, for example, be the case that alignment markers, and/or locations under and/or around alignment markers form a predetermined position and, respectively, the proximity of a predetermined position. In order to meet consistently high accuracy requirements, it may be required to periodically clean such positions without first waiting for contamination to be detectable. This may not only apply to alignment markers, but also to surfaces that are used for determining a position, such as mirror surfaces. Also, when determining lens qualifications, uncontaminated surfaces are needed. These surfaces may be cleaned by a method and a cleaning system as described above. In general, the apparatus may be arranged to clean at least one optical component and/or one position sensitive component. The apparatus may further be arranged such that when a position sensitive component, such as the substrate table, is cleaned, both sides of that component can be cleaned. Components to be cleaned may include mirror blocks (either side), optical sensors, and reflective elements of interferometers.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:

an illumination system constructed and arranged to condition a beam of radiation;

a support structure constructed and arranged to support a patterning device, the patterning device configured to impart the beam of radiation with a pattern in its cross-section;

a substrate table constructed and arranged to support a substrate;

a projection system for projecting the patterned beam of radiation onto a target portion of the substrate; and a cleaning system constructed and arranged to clean a component in the lithographic apparatus in situ, said cleaning system being arranged to provide a cleaning environment in proximity of a predetermined position on the component to be cleaned, said cleaning system further being arranged to provide the cleaning environment substantially independent of a type of contamination present at the predetermined position, wherein said cleaning system comprises a heating system constructed and arranged to heat the component to be cleaned in the proximity of the predetermined position, or a snow system constructed and arranged to locally provide snow particles, to remove the contamination.

2. An apparatus according to claim 1, wherein the cleaning system comprises the heating system constructed and arranged to heat the component to be cleaned in the proximity of the predetermined position.

3. An apparatus according to claim 2, wherein the heating system comprises a laser arranged to provide a beam with a wavelength that is absorbable by the component to be cleaned.

4. An apparatus according to claim 3, wherein the laser is arranged to provide a beam with a pulse longer than about 0.1 milliseconds and is arranged to provide a beam with a pulse shorter than about 15 nanoseconds.

5. An apparatus according to claim 3, wherein the laser is arranged to provide a beam with an infrared wavelength.

6. An apparatus according to claim 5, wherein the infrared wavelength is 1064 nm.

7. An apparatus according to claim 2, wherein the heating system comprises two lasers.

8. An apparatus according to claim 1, wherein the cleaning system comprises the snow system constructed and arranged to locally provide the snow particles.

9. An apparatus according to claim 8, wherein the cleaning system is arranged to provide a jet of the snow particles.

10. An apparatus according to claim 8, wherein the snow particles are formed from $CO_2$ and/or Ar.

11. An apparatus according to claim 1, wherein the component to be cleaned comprises the substrate table.

12. An apparatus according to claim 1, wherein the component to be cleaned comprises at least one optical component.

13. An apparatus according to claim 12, wherein the optical component comprises a mirror.

14. An apparatus according to claim 1, wherein the proximity to the predetermined position comprises locations that form at least part of the surrounding of an alignment marker and/or the component to be cleaned.

15. An apparatus according to claim 14, wherein the cleaning system is arranged to periodically provide the cleaning environment.

16. A cleaning system for cleaning a component in a lithographic apparatus in situ, the cleaning system being arranged to provide a cleaning environment in proximity of a predetermined position on the component, wherein the system is further arranged to provide the cleaning environment substantially independent of a type of contamination that is present at the predetermined position, and wherein the cleaning system comprises a heating system constructed and arranged to heat the component to be cleaned in the proximity of the predetermined position, or a snow system constructed and arranged to locally provide snow particles, to remove the contamination.

17. A cleaning system according to claim 16, wherein the proximity of the predetermined position comprises locations under and/or around an alignment marker.

18. A cleaning system according to claim 16, wherein the cleaning system is arranged to periodically provide the cleaning environment.

19. A cleaning method for removing contamination from a component in a lithographic apparatus in situ, the method comprising:
    creating a cleaning environment in proximity of a predetermined position on the component and that is independent of a type of contamination to be removed that is present at the predetermined position, said creating the cleaning environment comprising heating the component in the proximity of the predetermined position, or generating snow particles locally to the proximity of the predetermined position, to remove the contamination; and
    removing the contamination from the component in situ.

20. A cleaning method according to claim 19, wherein the method comprises the heating the component in the proximity of the predetermined position.

21. A cleaning method according to claim 20, wherein the heating comprises providing a laser beam with a wavelength that is absorbable by the component.

22. A cleaning method according to claim 21, wherein the method comprises pulsing the laser beam for longer than 0.1 milliseconds.

23. A cleaning method according to claim 21, wherein the laser beam has an infrared wavelength.

24. A cleaning method according to claim 23, wherein the infrared wavelength is 1064 nm.

25. A cleaning method according to claim 19, wherein the method comprises the generating snow particles locally to the proximity of the predetermined position.

26. A cleaning method according to claim 25, wherein the generating the snow particles locally comprises generating a jet of the snow particles.

27. A cleaning method according to claim 25, wherein the snow particles are formed from $CO_2$ and/or Ar.

28. A cleaning method according to claim 19, wherein the component comprises a substrate table.

29. A cleaning method according to claim 19, wherein the component comprises at least one optical component.

30. A cleaning method according to claim 29, wherein the optical component comprises a mirror.

31. A cleaning method according to claim 19, wherein the proximity of the predetermined position comprises locations under and/or around an alignment marker.

32. A cleaning method according to claim 19, wherein the method comprises periodically creating the cleaning environment.

33. A cleaning method for removing contamination from a component in a lithographic apparatus in situ, the method comprising:
    detecting the contamination on the component;
    identifying a predetermined position to be cleaned on the component; and
    cleaning the predetermined position with a cleaning system in situ, the cleaning system being arranged to provide a cleaning environment in proximity of the predetermined position, wherein the system is further arranged to provide the cleaning environment substantially independent of a type of contamination that is present a the predetermined position, and wherein said cleaning comprises heating the component in the proximity of the predetermined position, or generating snow particles locally to the proximity of the predetermined position, to remove the contamination.

* * * * *